United States Patent
Wynn (10) Patent No.: US 6,587,528 B1
(45) Date of Patent: Jul. 1, 2003

(54) SYSTEMS AND METHODS FOR EXTRACTING AND DIGITIZING PHASE AND FREQUENCY INFORMATION FROM AN ANALOG SIGNAL

(75) Inventor: Stephen Robert Wynn, Lynchburg, VA (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/169,863

(22) Filed: Oct. 12, 1998

(51) Int. Cl.[7] .............................................. H04L 7/04
(52) U.S. Cl. ...................................... 375/362; 375/371
(58) Field of Search ............................... 375/375, 374, 375/376, 344, 362, 371, 377; 708/309, 311

(56) References Cited

U.S. PATENT DOCUMENTS

| | | | | |
|---|---|---|---|---|
| 3,651,414 A | * | 3/1972 | Jamieson | 327/49 |
| 4,247,938 A | * | 1/1981 | Kurihara et al. | 714/705 |
| 4,308,505 A | * | 12/1981 | Messerschmitt | 331/25 |
| 4,587,496 A | * | 5/1986 | Wolaver | 331/1 A |
| 4,739,278 A | * | 4/1988 | Des Brisay, Jr. et al. | 327/7 |
| 4,803,705 A | * | 2/1989 | Gillingham et al. | 375/376 |
| 5,084,669 A | | 1/1992 | Dent | |
| 5,111,160 A | * | 5/1992 | Hershberger | 331/1 |
| 5,220,275 A | | 6/1993 | Holmqvist | |
| 5,278,874 A | * | 1/1994 | Liu et al. | 375/376 |
| 5,416,691 A | * | 5/1995 | Croughwell | 363/60 |
| 5,446,416 A | * | 8/1995 | Lin et al. | 331/11 |
| 5,511,100 A | * | 4/1996 | Lundberg et al. | 375/376 |
| 5,630,215 A | * | 5/1997 | Waldie et al. | 455/192.2 |
| 5,719,908 A | * | 2/1998 | Greeff et al. | 375/376 |
| 5,745,314 A | * | 4/1998 | Ikeda et al. | 360/51 |
| 5,889,828 A | * | 3/1999 | Miyashita et al. | 375/374 |
| 5,903,195 A | * | 5/1999 | Lukes et al. | 331/4 |
| 5,991,350 A | * | 11/1999 | Yamamoto | 375/376 |
| 6,031,428 A | * | 2/2000 | Hill | 331/11 |
| 6,256,362 B1 | * | 7/2001 | Goldman | 375/373 |
| 6,307,891 B1 | * | 10/2001 | Hein et al. | 375/285 |
| 6,337,589 B1 | * | 1/2002 | Ooishi | 327/156 |

* cited by examiner

*Primary Examiner*—Jean Corrielus
(74) *Attorney, Agent, or Firm*—Myers Bigel Sibley & Sajovec PA (57) ABSTRACT

Systems for periodically determining and digitally representing the phase and/or frequency of an input signal are disclosed which include a frequency discriminator, a phase discriminator and a control network. The frequency and phase discriminators may be used to periodically sample and estimate, respectively, the frequency and phase of an input analog signal, and these estimates are provided to a control network which calculates an error estimate and adjusts the estimate of the frequency provided by the frequency discriminator based on this estimate of the error. The systems of the present invention may further include means for digitally representing the phase and/or frequency of the input signal, and may also include a frequency-to-phase converter coupled to the output of the control network which converts the adjusted output of the frequency discriminator into a phase value. Associated methods for extracting and digitizing phase and frequency information from an analog input signal are also disclosed.

22 Claims, 5 Drawing Sheets

SYSTEMS AND METHODS FOR EXTRACTING AND DIGITIZING PHASE AND FREQUENCY INFORMATION FROM AN ANALOG SIGNAL

FIELD OF THE INVENTION

The present invention relates generally to extracting and converting into a digital representation the information-bearing component of a signal and, more particularly, to systems and methods for extracting and digitizing phase and/or frequency information contained in an analog signal.

BACKGROUND OF THE INVENTION

In many electronic applications, and in particular, in radio communication systems, the phase or frequency of an analog electrical signal carries information which may be detected and used by an end user. To facilitate such detection and use, it may be advantageous to sample the analog signal, extract phase or frequency information, and represent that information in a digital representation. For example, such extraction and conversion to a digital representation allows for demodulation of phase or frequency modulated radio signals using small, low cost, and low power digital signal processors. Use of such digital processing techniques may even be more preferred if additional numerical processing of the received signal is required such as, for example, de-interleaving or decoding operations. Moreover, even if extensive downstream processing is not required, digital processing, in many instances, may be more accurate and/or easier to implement than corresponding analog processing methods. Accordingly, systems and circuits for extracting and digitizing the frequency or phase of a signal are utilized in a wide variety of electronic applications.

As mentioned above, systems for extracting and digitizing frequency and/or phase information are particularly useful in a wide variety of radio communications applications, as the information carried by the radio signal is often encoded in the signal by modulating the phase or frequency of the signal. Thus, by extracting and digitizing phase or frequency information, digital demodulation of a phase or frequency modulated signal may be accomplished.

Typically, phase or frequency information is extracted from the received radio frequency ("RF") signal after it has been downconverted at the receive terminal to an intermediate ("IF") frequency (e.g., 450 kHz). However, it may also be extracted directly from the RF carrier, or at some other frequency. Conventionally, the frequency or phase of the received signal is represented relative to the frequency or phase of the RF or IF carrier signal, although other reference signals may be used.

A variety of systems and circuits for extracting and/or digitizing frequency and phase information are known in the art. For instance, a conventional method to extract and digitize the phase of an alternating current electrical signal is to apply the signal, along with a known reference signal, to a phase comparator. In response to these inputs, the phase comparator produces an output voltage or current which is proportional to the phase difference between the input signal and the reference signal. This analog representation of the phase of the input signal may then be applied to an analog-to-digital ("A/D") converter, which, at some specified rate, samples and outputs in digital format the values of the phase of the input signal. Devices or systems that extract and digitize the phase of an analog signal, such as the combination of a phase comparator and an A/D converter, are commonly referred to as phase digitizers. Moreover, as will be understood by those of skill in the art, phase and frequency have a close mathematical relationship in that frequency is the time derivative of phase. Accordingly, if frequency, as opposed to phase, information is desired, the frequency information may be obtained from the phase samples via differentiation. As the phase information is in a digital representation at the output of the phase digitizer, a digital representation of the frequency information may conveniently be obtained via numerical differentiation of the phase samples using modulo $2\pi$ (circular) arithmetic subtraction.

While phase digitizers typically perform well in conventional phase modulated digital communication systems which use widely spaced phase modulations (such as BPSK or QPSK), their performance may be less than satisfactory in communication systems which use finely spaced phase modulations such as 32-PSK or 64-PSK. This problem may arise because the quantization of the phase from the received IF signal is a function of the ratio of the clock rate of the phase digitizer as compared to the IF frequency. By way of example, if 16-bit phase resolution is desired (as opposed to the 5 or 6 bits of phase resolution typically available in BPSK and QPSK demodulators), the digitizer clock would need to operate at $2^{16}$ times the IF frequency. Thus, to provide 16 bits of phase quantization when operating at a typical IF frequency of 450 kHz, the digitizer clock would need to run at nearly 29 GHz, which may be prohibitive both in terms of component costs and the current drain on the terminal.

In addition to limiting the use of phase digitizers to widely digital phase modulations, the above-described quantization noise problem may render the use of phase digitizers unsuitable for use in many analog systems, such as frequency modulated ("FM") analog radio systems. This occurs because the noise introduced by a low quantization level of the analog signal causes the demodulated signal to noise ratio to decrease noticeably. As such, phase digitizers which operate at clock rates at least ten times the 19.2 MHz rate of conventional phase digitizer clocks are likely required to meet the link hum and noise tolerances specified in many analog FM applications. Accordingly, quantization noise concerns typically limit the use of conventional phase digitizers with both high order digital phase modulations (such as 32- or 64-PSK) and analog FM systems.

A second conventional method of extracting frequency (and/or phase) information from an analog signal is to use an analog frequency discriminator to obtain frequency samples from the signal. If digitization is required, the analog output of the frequency discriminator may be digitized using an analog-to-digital ("A/D") converter. Devices or systems that extract and digitize the frequency of an analog signal, such as the combination of a frequency discriminator and an A/D converter, are commonly referred to as frequency digitizers. Moreover, as phase is the time integral of frequency, such a frequency digitizer may also be used to extract and digitize phase information from an analog signal by re-integrating the frequency samples.

While frequency discriminators and frequency digitizers may be acceptable for various analog communication techniques such as conventional FM radio, in practice, problems arise when frequency discriminators are used in digital communications systems such as DQPSK. The principal difficulty arises in the integration step which is necessary to convert the frequency samples into phase information, as the accuracy of the resulting phase information is dependent on the accuracy of the amplitude, or "level," of the output of the frequency discriminator. This problem arises because the output signal level (i.e., the amplitude of the frequency) of commercially available frequency discriminators may vary significantly from unit-to-unit as a result of component variations, and the output may further vary with temperature. As a result, analog frequency discriminators typically are unable to extract phase information with sufficient accuracy to be of use in many digital communication systems.

In light of the above-mentioned problems with existing frequency and phase discriminators and digitizers, a need exists for phase/frequency discriminators and digitizers that provide very accurate phase or frequency information that is generally unaffected by quantization noise. Moreover, a need also exists for phase and frequency discriminators and digitizers that work well with all modulation types.

SUMMARY OF THE INVENTION

In view of the above limitations associated with existing frequency discriminators and phase digitizers, it is an object of the present invention to provide electronic devices or systems which produce the digital value representation of the phase angle and/or frequency of an AC signal which work well with both analog and digital modulation techniques.

Another object of the present invention is to provide phase/frequency discriminators and digitizers which accurately extract the phase and/or frequency of a received signal.

It is still a further object of the present invention to provide phase/frequency discriminators or digitizers which exhibit low quantization noise.

Additional objects, features and advantages of the present invention will become apparent upon reading the following detailed description and appended claims and upon reference to the accompanying drawings.

These and other objects of the present invention are provided by systems and methods for extracting and optionally digitizing phase and frequency information from an analog electrical signal which use a phase digitizer or discriminator to sample and measure the amplitude of the analog signal, and then use this information to correct frequency (or phase) estimates obtained from a conventional frequency discriminator. In this manner, it is possible to reduce the error in output frequency levels associated with currently available frequency discriminators, while similarly avoiding the quantization noise effects which arise when conventional phase digitizers or discriminators are used to extract phase or frequency information from an analog signal. Thus, through the teachings of the present invention, systems and methods for accurately extracting phase and frequency information are provided which avoid both the accuracy and quantization noise problems associated with prior art extraction techniques.

In one embodiment of the present invention, a system for periodically determining the phase and/or frequency of an input signal is provided which includes a frequency discriminator, a phase discriminator and a control network. In this embodiment, the frequency and phase discriminators are used to periodically sample an analog input signal and measure, respectively, the frequency and phase of that signal. These frequency and phase samples, in turn, are provided to a control network, which, responsive to these measurements, adjusts the estimates of the frequency provided by the frequency discriminator. The systems of the present invention may further include means for digitally representing the phase and/or frequency of the input signal, and may also include a frequency-to-phase converter coupled to the output of the control network for converting the adjusted output of the frequency discriminator into a phase value. In a specific embodiment of the present invention, the control network comprises an error estimator which produces an error signal based on the outputs of the frequency discriminator and the phase discriminator and adjusting means responsive to the error signal for adjusting the amplitude of the output of the frequency discriminator. In this embodiment, the system may further include a phase-to-frequency converter coupled to the output of the phase discriminator and the error estimator may be used to periodically calculate the difference between the outputs of the frequency discriminator and the phase-to-frequency converter. This error estimator comprises means for calculating the absolute value of the difference between the frequency estimates provided by the phase and frequency discriminators. The error estimator may further include a low pass filter or other averaging circuit or system for averaging the calculated differences between the outputs of the frequency discriminator and the phase discriminator.

In still another embodiment of the present invention, the frequency of an input signal relative to a reference frequency is determined using a frequency discriminator and a phase discriminator. The frequency is determined by refining the estimate of the frequency of the input signal provided by the frequency discriminator based on the estimate of the phase of the input signal provided by the phase discriminator. In another embodiment, the phase and/or frequency of an input signal relative to a reference signal are determined by (i) generating a digital representation of a first estimate of the frequency of the input signal using a frequency discriminator, (ii) generating a digital representation of a first estimate of the phase of the input signal using the phase digitizer, (iii) converting the digitized first estimate of the phase into a second estimate of the frequency of the input signal, (iv) estimating an error in the first estimate of the frequency based on the second estimate of the frequency, and (v) adjusting the first estimate of the frequency based on the estimated error. Thus, it is possible to obtain highly accurate estimates of the phase and frequency of an analog signal that may be unaffected by quantization noise effects.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Additionally, it will be understood by those of skill in the art that the present invention may be advantageously used in a variety of applications, and thus the present invention should not be construed as limited in any way to the example applications described herein. Like numbers refer to like elements throughout.

Figure 1:
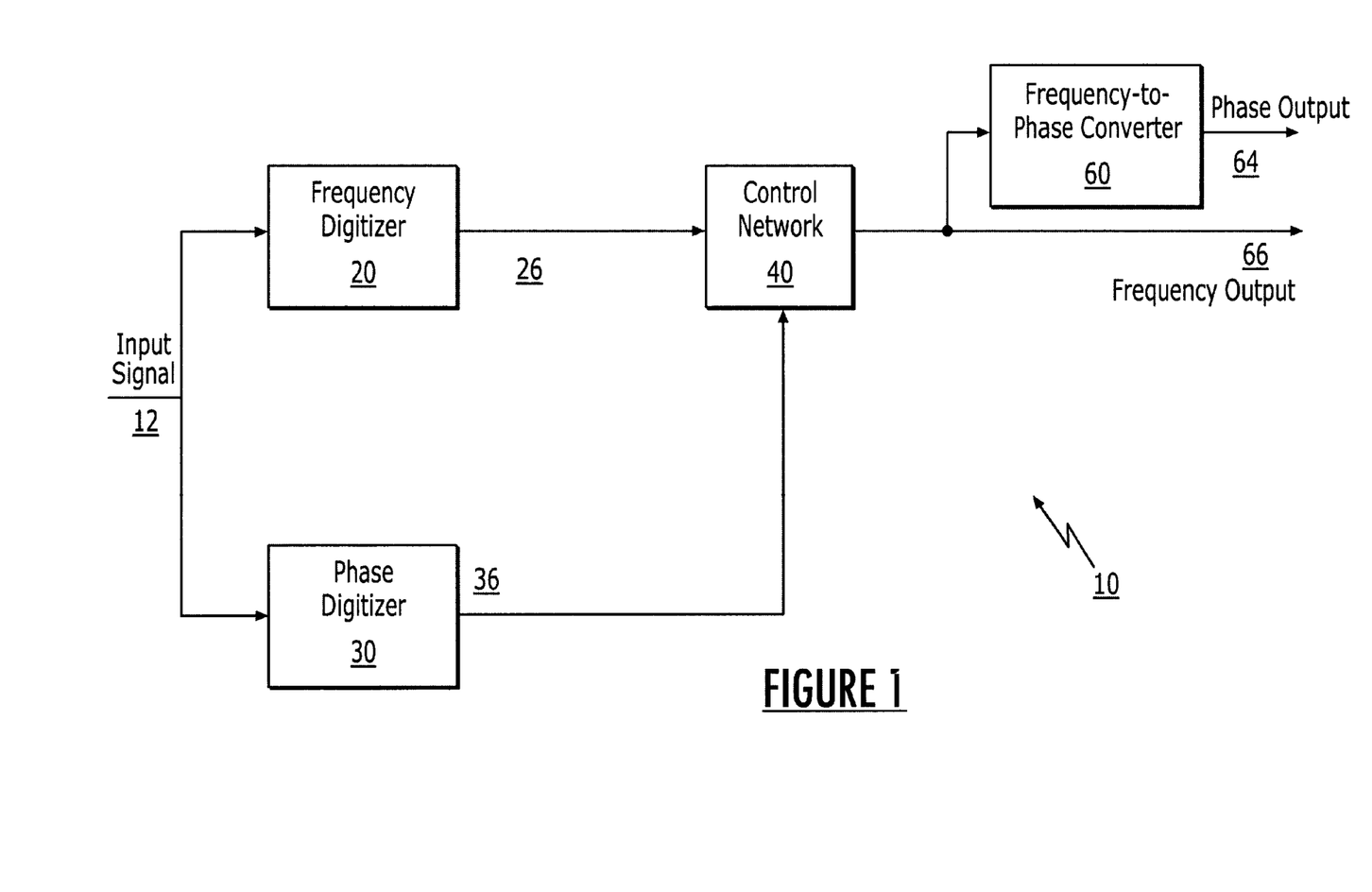
FIG. 1 is a block diagram of a phase/frequency extraction and/or digitization system according to the present invention.

A block diagram of a system 10 which implements the principles of the present invention is illustrated in FIG. 1. As illustrated therein, the system comprises a frequency digitizer 20, a phase digitizer 30 and a control network 40. The input signal 12, which, for example, might be an intermediate frequency ("IF") signal received at a wireless communications terminal or base station, is input to both the frequency digitizer 20 and the phase digitizer 30.

As will be understood by those of skill in the art, frequency digitizer 20 is a device or circuit which periodically extracts and represents in a digital format the frequency of input analog signal 12 during a sample period or periods. In a preferred embodiment of the present invention, frequency digitizer 20 may be implemented as the combination of an analog frequency discriminator 22 (not shown in FIG. 1) which extracts the frequency information, and an analog-to-digital ("A/D") converter 24 (also not shown in FIG. 1) which digitizes the analog (voltage or current) output from the frequency discriminator. As will be understood by those of skill in the art, frequency discriminator 22 may be implemented using a phase locked loop, a quadrature detector, a ceramic or crystal tuning element, or a variety of other known methods for sampling the frequency of an input analog signal. Similarly, a wide variety of A/D converters 24 are known to those of skill in the art. However, it will be understood that the present invention is not limited to frequency digitizers comprising a frequency discriminator and an A/D converter, as any circuit or system which extracts and digitizes the frequency of an analog signal during a sample period or periods may be used with the embodiment of the present invention depicted in FIG. 1.

In the embodiment of FIG. 1, input signal 12 is also applied to a phase digitizer 30. Phase digitizers are electrical circuits or devices which may be used to periodically determine the phase of an input analog signal during a sample period or periods, and represent such phase values in a digital format. These phase values 36 are made available at the output of phase digitizer 30. A variety of phase digitizers 30 are known in the art, such as, for example, those disclosed and/or discussed in U.S. Pat. No. 5,084,669 entitled "Direct Phase Digitization" and U.S. Pat. No. 5,220,275 entitled "Accumulator Phase Digitizer." Preferably, the sample rates and sample times of frequency digitizer 20 and phase digitizer 30 are reasonably well-matched.

As illustrated in FIG. 1, both the frequency estimates 26 provided by frequency digitizer 20 and the phase estimates 36 provided by phase digitizer 30 are coupled to a control network 40. In response to these inputs, control network 40 estimates the error in either the frequency estimates 26 provided by frequency digitizer 20 or in the phase estimates 36 provided by phase digitizer 30. Based on this error estimate, control network 40 adjusts subsequent corresponding frequency or phase estimates 26, 36 to eliminate the estimated error. Thus, by way of example, in an embodiment of the present invention which estimates the error in the frequency samples 26, control network 40 adjusts subsequent frequency samples 26 in an effort to eliminate the estimated error.

The output of control network 40 typically is either frequency 66 or phase 64 samples which have been adjusted to minimize error as described above. For example, in the embodiment of the present invention depicted in FIG. 1, control network 40 outputs adjusted frequency samples 66.

In wireless communication terminals designed to receive frequency modulated signals, these corrected estimates of the frequency 66 may be provided directly to an integrated circuit, a digital signal processor or whatever other system or circuit performs the downstream signal processing. Alternatively, in wireless terminals designed to receive phase modulated signals, a frequency-to-phase converter 60 may optionally be provided which converts the frequency samples 66 into phase samples 64.

The embodiment of the present invention depicted in FIG. 1 operates as follows. Analog input signal 12 is fed to both frequency digitizer 20 and phase digitizer 30, which periodically sample, extract and digitize estimates of the frequency 26 and phase 36 of signal 12 respectively. These frequency estimates 26 and phase estimates 36 are applied to control network 40, typically at a rate equal to the sampling rates of frequency digitizer 20 and phase digitizer 30.

As noted above, the frequency estimates provided by conventional frequency discriminators and digitizers typically only roughly reflect the actual amplitude of the frequency of the sampled signal. Similarly, the accuracy of conventional phase digitizers is also less than perfect due to errors introduced by their relatively high levels of quantization noise. However, according to the present invention, the frequency (or phase) estimates provided by one such device can be used to estimate the error introduced by the other type of device.

For instance, most conventional phase digitizers introduce unacceptable levels of quantization noise in certain applications. This quantization error, however, while potentially significant on any given sample, should average out to essentially zero over a large number of samples. Thus, pursuant to the teachings of the present invention, it will be understood that a conventional phase digitizer (when coupled with phase-to-frequency converter) may be used to obtain very accurate estimates of the level of the frequency of analog input signal 12 by averaging over a large number of the phase/frequency samples (e.g., 10,000 samples) obtained via phase digitizer 30. This information may then be used to estimate and correct the amplitude error in the estimates of the frequency 26 provided by frequency digitizer 20. This "adjusted" or "corrected" estimate of the frequency 66 (or phase 64) may then be output to a downstream processor. Thus, pursuant to the teachings of the present invention, it is possible to combine two different methods for extracting phase and frequency information from an analog signal to realize systems for phase and frequency extraction which are very accurate, linear, and virtually unaffected by quantization noise effects, in a single design which should work well with virtually any type of phase or frequency modulated signal. Moreover, by combining the best aspects of conventional phase and frequency discriminators/digitizers, it is possible to provide such a high-accuracy device without significantly increasing either its current drain or its cost.

Figure 2:
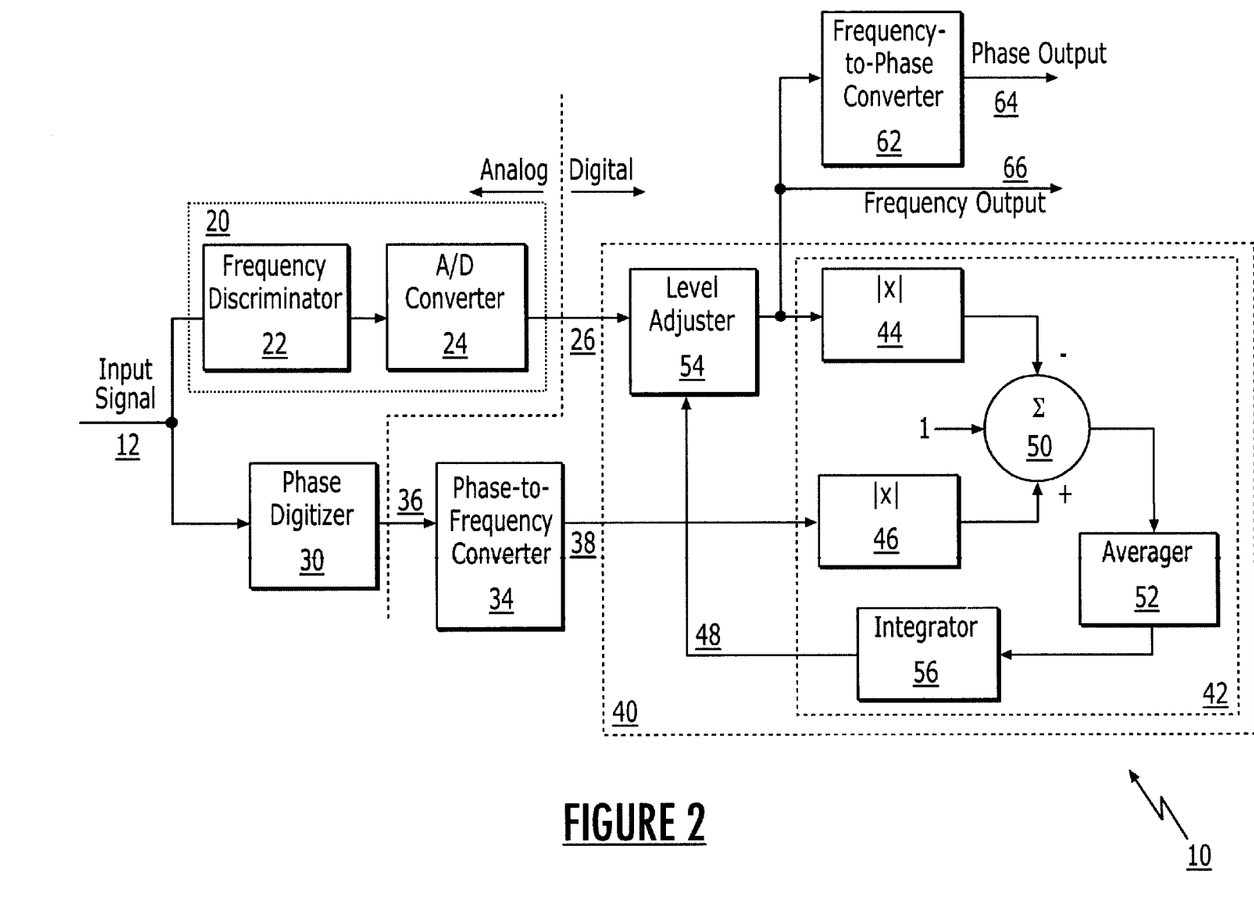
FIG. 2 is a block diagram illustrating a specific embodiment of a system for extracting and digitizing phase/frequency information according to the present invention.

A preferred embodiment of the phase/frequency extraction and digitization systems 10 of the present invention is illustrated in FIG. 2. As in the embodiment of FIG. 1, the embodiment of the present invention depicted in FIG. 2 feeds input signal 12 to both a frequency digitizer 20 and to a phase digitizer 30. In this embodiment, frequency digitizer 20 comprises an analog frequency discriminator 22 and an A/D converter 24. Frequency digitizer 20, therefore, outputs a digital representation of the estimates 26 of the frequency of input signal 12.

As is also shown in FIG. 2, phase digitizer 30 outputs, in digital format, estimates of the phase of input signal 12. These phase values 36 are then input to a phase-to-frequency converter 34. This device takes the time derivative of the phase values 36 to thereby convert the digitized estimates 36 of the phase of input signal 12 into a digitized estimate 38 of the frequency of input signal 12. The two separate estimates 26, 38 of the frequency of input signal 12 are then fed to control network 40.

In the embodiment illustrated in FIG. 2, control network 40 comprises an error estimator 42 and a level adjuster 54. The estimates of the frequency 26, 38 are input into error estimator 42 (note that frequency estimate 26 is input indirectly in that it is first operated on via level adjuster 54), which averages (via average 52) the difference of the absolute values of these inputs (via adder 50) to generate an error signal 48. This error signal 48, which represents an estimate of the error in the amplitude of the frequency samples 26, is provided to level adjuster 54. Based on error signal 48, level adjuster 54 scales or adjusts the amplitude of each successive frequency estimate 26 to more accurately reflect the actual frequency of input signal 12. Typically, the adaptive feedback loop 44, 46, 50, 52, 54 of error estimator 42 converges on a steady state value. Once this occurs, the estimates 66 of the frequency should accurately reflect, in digital format, the frequency of input analog signal 12, and the estimates 64 (which are derived from the frequency estimates 66 by frequency-to-phase converter 62) should accurately reflect the phase of input signal 12.

While, in the embodiment of the present invention illustrated in FIG. 2, error signal 48 is determined by taking the absolute value of the difference of the frequency estimates 26, 38 provided by frequency digitizer 20 and phase digitizer 30, it will be understood by those of skill in the art that the error in the frequency samples 26 may be estimated in a variety of different ways. For instance, in an alternative embodiment, the error might be calculated as merely proportional to the difference in estimates 26, 38. It will be understood that error signal 48 may be calculated differently than illustrated in the embodiment of FIG. 2. For example, the absolute value functions 44, 46 might be replaced with an absolute value function implemented after summation 50 of frequency estimates 26, 38. Similarly, while the embodiment of FIG. 2 calculates the difference of the absolute values 44, 46 of frequency estimates 26, 38 using an adder, it will be understood that any conventional mechanism for calculating such differences may be used. Accordingly, the present invention is not to be limited to the embodiment of error estimator 42 illustrated in FIG. 2, but instead is intended to encompass all embodiments falling within the enumerated claims set forth herein.

As discussed above, in the embodiment of FIG. 2 adder 50 calculates the difference in the absolute values of frequency estimates 26, 38. These difference values are then filtered or averaged (via averager 52, which, for example, may be implemented as a low pass filter) to obtain error signal 48. As discussed above, this averaging is preferable because cost and/or current drain considerations may limit the rate of the clock associated with phase digitizer 30, which in turn may introduce unacceptable levels of quantization noise, particularly at higher IF frequencies. However, by including an averager or filter in the adaptive feedback loop 44, 46, 50, 52, 54 of error estimator 42, the quantization noise introduced by phase digitizer 30 is averaged out and hence should have little or no effect on the error signal 48 used to adjust the frequency estimates 26.

Preferably, the bandwidth of averager 52 is set to average over a large number of samples (e.g., 10,000) to fully eliminate any short term errors and/or quantization noise effects. For instance, if the sample times or sample rates of frequency digitizer 20 and phase digitizer 30 are not well matched, this can result in jitter effect which will be stripped off the loop as it averages over a sufficiently large number of samples. However, it will be understood that the present invention will work with a wide variety of different bandwidths. Moreover, it will also be understood that averager 52 may be implemented via a wide variety of averaging techniques such as a digitally implemented averager or a low pass filter.

As discussed earlier, in operation the adaptive feedback loop 44, 46, 50, 52, 54 uses each new successive set of frequency samples 26, 38 to revise error signal 48 and thereby continually refine the scaling adjustment performed by level adjuster 54 on the frequency estimates 26. It is expected that once the control loop converges on a steady-state value for error signal 48 it will, for the most part stay converged, as the error introduced by currently available frequency discriminators 22 is primarily a fixed error resulting from unit-to-unit component variations. Accordingly, it will be understood that constant adaptation is generally not required, as, in many cases, a reasonably good estimate of the error might be obtained from a single or small number of samples. However, in a preferred embodiment of the present invention, an adaptive control loop such as the loop 44, 46, 50, 52, 54 illustrated in FIG. 2 is provided, as the loop will also correct for other errors present in the frequency estimates 26, such as those resulting from variations in the temperature of frequency discriminator 22 or jitter introduced by mismatched sampling rates between frequency digitizer 20 and phase digitizer 30.

Additionally, as is also illustrated in FIG. 2, an integrator 56 may optionally be included in adaptive loop 44, 46, 50, 52, 54. This integrator may advantageously force the loop to more quickly determine the steady state value of error signal 48.

As illustrated in FIG. 2, error signal 48 is applied to level adjuster 54 which scales the frequency samples 26 in response. In a preferred embodiment of the present invention, this level adjuster comprises a digitally controlled attenuator, which, for example, could be implemented as a multiplier or as a shift/add circuit. However, it will be understood that numerous other circuits and/or hardware or software systems are known in the art for scaling a signal, and this level adjuster 54 could be implemented in any of these ways (e.g., as an analog amplifier).

In the embodiment of FIG. 2, adder 50 includes a third input which adds 1.0. This is provided to force the attenuator to unity gain in the case of no error (i.e., when the values output from absolute value generators 44, 46 are identical). This allows the scaling performed by level adjuster 54 to adjust relative to unity when an error is present. While not required, in some embodiments the addition of the unity input to adder 50 may facilitate use of cheap, readily available components.

The embodiment of the present invention illustrated in FIG. 2 also includes both a phase-to-frequency converter 34 and a frequency-to-phase converter 62. While these devices may be implemented in a wide variety of ways, in a preferred embodiment of the present invention they are implemented arithmetically in a digital signal processor which performs the frequency-to-phase conversion using modulo $2\pi$ (circular) arithmetic addition and the phase-to-frequency conversion using arithmetic subtraction.

Figure 3:
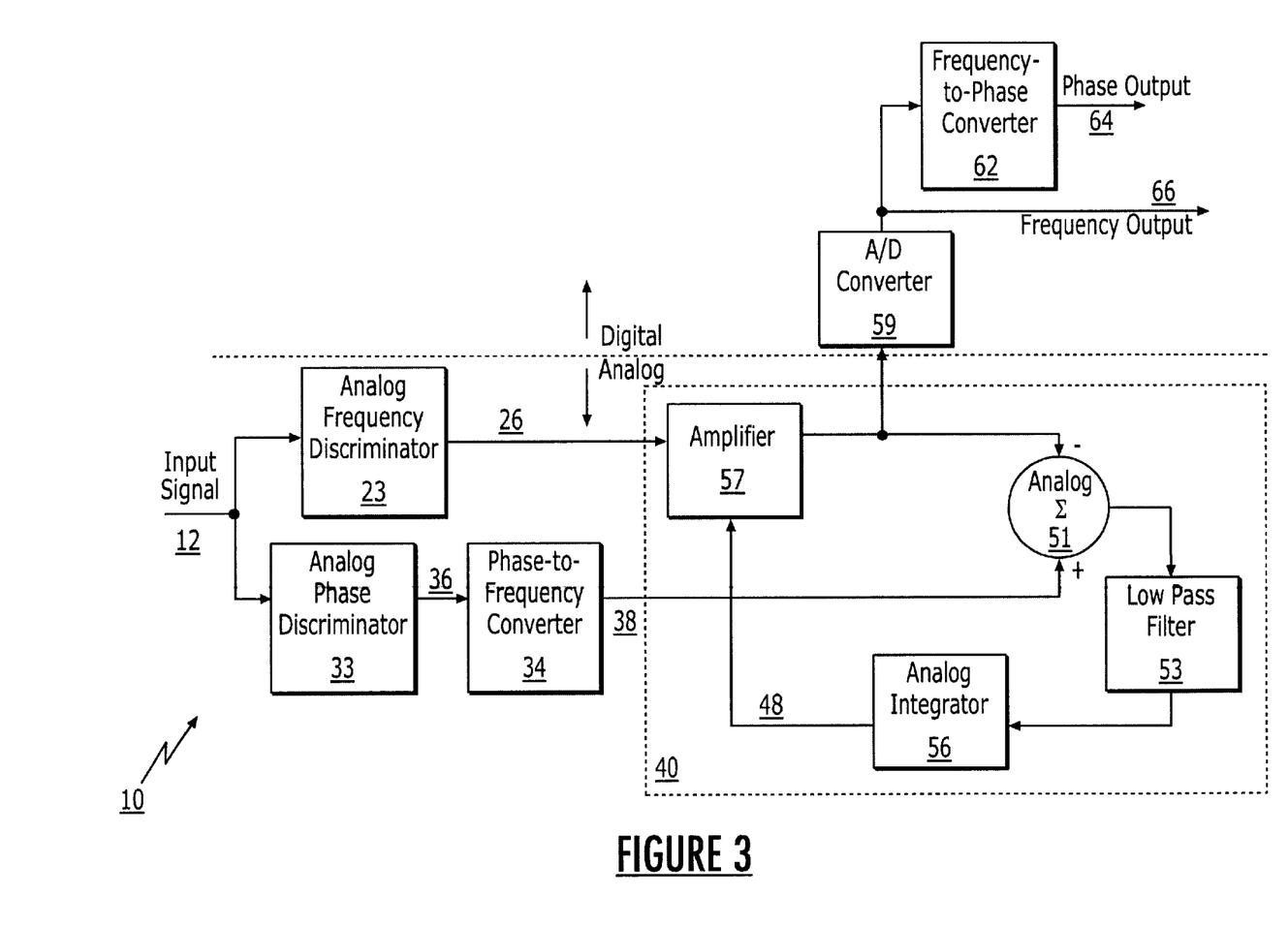
FIG. 3 is a block diagram illustrating another embodiment of a system for extracting and digitizing phase/frequency information according to the present invention.

While the embodiment illustrated in FIG. 2 performs most functions in the digital domain, those of skill in the art will understand that similar embodiments could be implemented which perform either more, or less, of the illustrated functions in the analog domain. For example, FIG. 3 illustrates an alternative embodiment of the present invention which performs the vast majority of the illustrated functions in the analog domain. As shown in FIG. 3, analog frequency and phase discriminators 22, 33 are used, such that the frequency estimates provided to control network 40 are in the form of pair of analog signals. Control network 40 is similarly implemented using an analog adder 51, a low pass filter 53, an analog integrator 55 and an amplifier 57. As shown in FIG. 3, if digitization of the phase/frequency information is required, the output of amplifier 57 may be applied to an A/D converter 59. As in the embodiment of FIG. 2, a frequency-to-phase converter 62 may also be included if phase, as opposed to frequency, information is required. Note that as used herein, a "phase discriminator" refers to a device which extracts the phase from an analog signal, although it need not necessarily digitize the extracted phase value (as is the case with a "phase digitizer").

Alternatively, the phase/frequency digitization and extraction systems 10 of the present invention could be implemented, in almost their entirety, digitally. For instance, frequency discriminator 22 could conceivably be implemented as a digital device, in which case input signal 12 could be fed directly to an A/D converter which in turn would provide the input signal in digital format to the digital embodiment of the frequency discriminator 22. Numerous other configurations are similarly possible (e.g., using a phase discriminator instead of phase digitizer 30, thereby allowing phase-to-frequency converter 34 to be implemented as an analog device). However, in many applications it may be preferable to implement control network 40 digitally using a digital signal processor, a specialized or general purpose integrated circuit, or any of numerous other digital hardware or software implementations that are well known to those of skill in the art.

Pursuant to another aspect of the present invention, frequency discriminator 22 is preferably designed so as to provide a substantially linear response across the bandwidth of input analog signal 12 (which typically is the IF bandwidth). Thus, the slope of the voltage out versus frequency in preferably varies less than 1% across the desired range, and more preferably frequency discriminator 22 will operate with less than 0.1% variation as measured across the bandwidth of operation. Preferably, this linearity is maintained over the temperature range at which frequency discriminator 22 is expected to operate.

Frequency discriminator 22 may be designed/selected to provide such linear operation both through the type of frequency discriminator selected and/or by selection of components that naturally are relatively linear. For instance, in many applications a wide band quadrature detector may operate more linearly than a narrow band quadrature detector, and a phase locked loop may often provide even better linearity across the receive bandwidth. Accordingly, both in selecting parts and the type of frequency discriminator, preferably emphasis is placed on linearity, as opposed to the accuracy of the level of the output signal. This is possible, as by the teachings of the present invention, errors in the accuracy of the output level are eliminated by the adaptive loop in control network 40.

As will be understood by those of skill in the art, a typical radio communications terminal will require either phase or frequency information, but typically not both, as the demodulator only requires information regarding the signal parameter (i.e., phase or frequency) used to encode the transmitted waveform. However, implementations of the present invention which provide both outputs may be commercially desirable, as a single circuit or system could then be used in multiple applications. Accordingly, in a preferred embodiment of the present invention phase/frequency digitizer 10 outputs both frequency 66 and phase 64 information, to facilitate mass production of a phase/frequency digitizer 10 which can be used with a wide variety of wireless communications terminals and base stations.

In the embodiment of the present invention illustrated in FIGS. 2 and 3, the adaptation is performed using frequency samples, thereby eliminating the phase wrap issue discussed in U.S. Pat. No. 5,084,669 which effects the performance of many phase digitizers. However, those of skill in the art will understand that the adaptive loop of error estimator 42 could also calculate error signal 48 based on phase samples, as methods of avoiding the phase wrap issue are known in the art. Accordingly, the present invention is not limited to systems which correct the output of a frequency discriminator based on a comparison of frequency samples, but also is intended to encompass similar systems which adjust the output based on a comparison of phase samples.

Figure 4:
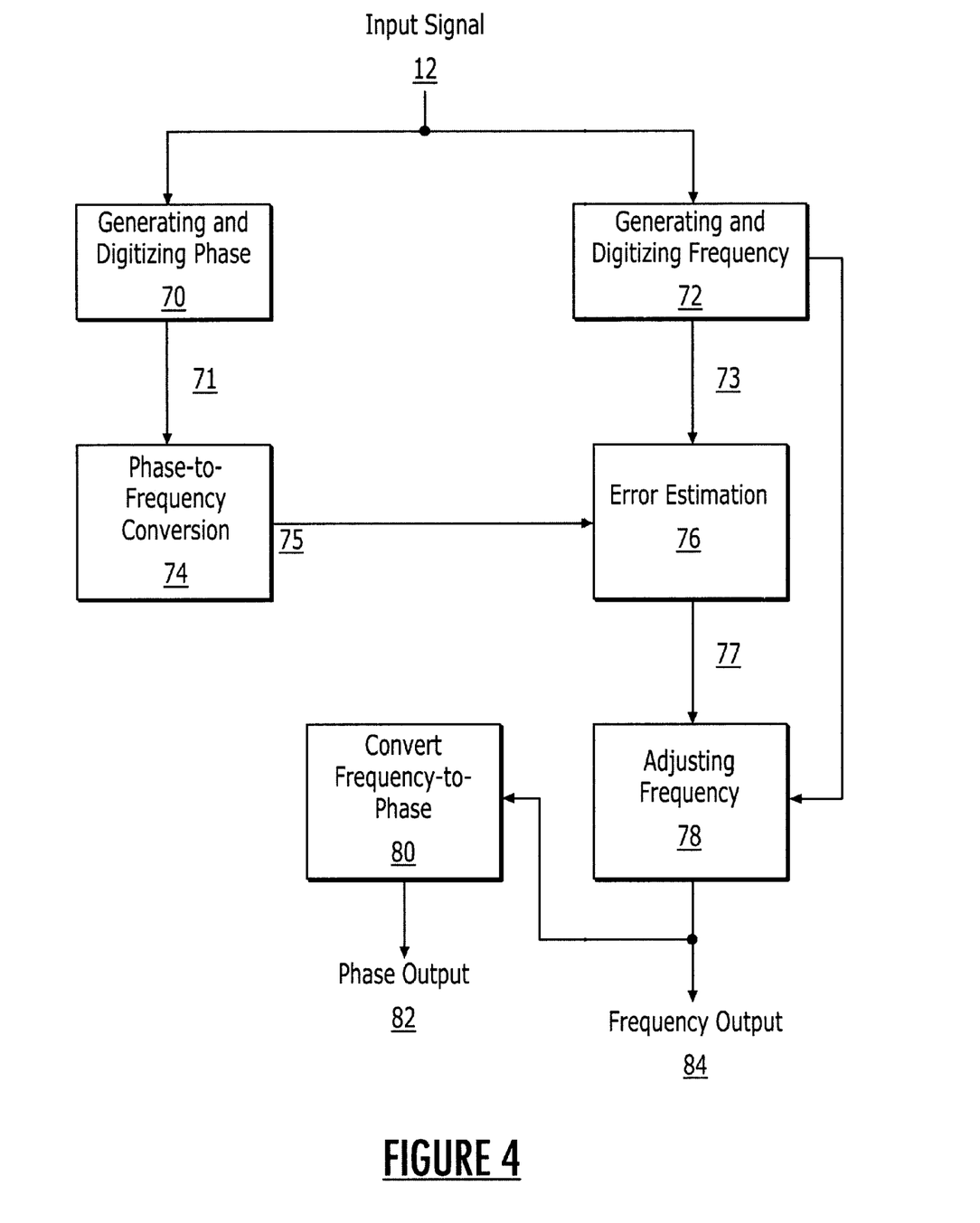
FIG. 4 is a flow chart illustrating a method for extracting and digitizing phase and frequency information according to the present invention.

Operations for extracting and digitizing phase and frequency information from an input signal 12 are illustrated in the block diagram of FIG. 4. Referring to FIG. 4, it is seen that pursuant to these methods, the input analog signal 12 is split, and then estimates of both the frequency 73 and phase 71 of input signal 12 are generated and digitized (blocks 70, 72). In the embodiment of FIG. 3, the digitized phase estimate 71 is converted into a second frequency estimate 75 via a phase-to frequency conversion (block 74). An error estimation 76 for determining the error in frequency estimate 73 may then be performed, and frequency estimate 73 may then be adjusted (block 78) to correct for this error. If phase information 82 is desired, it, in turn, may be obtained from the adjusted estimate of the frequency 84 via a frequency-to-phase conversion (block 80). In this manner, pursuant to the teachings of the present invention, an accurate estimate of the frequency of an analog signal 12 may be obtained by generating estimates of both the phase and frequency of signal 12, and using the phase information to estimate, and correct, any error in the initial estimate of the frequency.

As discussed above, with respect to the frequency/phase digitizers 10 according to the present invention shown in FIGS. 1–3, the present invention encompasses a wide variety of implementations, including both mostly analog and most digital systems, systems that use a phase digitizer or discriminator to correct the output of a frequency discriminator or digitizer, and systems that alternatively use a frequency digitizer or discriminator to correct the output of a phase digitizer or discriminator. Accordingly, the methods of the present invention likewise extend to methods corresponding to each of the variants of phase/frequency digitizer 10 described herein, as indicated in the claims appended hereto.

While the systems and methods for determining and digitizing phase and frequency information described herein have primarily been described in the radio communications context, those of skill in the art will recognize that the systems and methods of the present invention are equally applicable in a wide range of other applications, such as in equalizers and radar systems. Accordingly, it is to be understood that the scope of the present invention is not limited to systems and methods for determining and optionally digitizing phase and frequency information in radio communications systems, but instead the scope is as set forth in the claims appended hereto.

Figure 5:
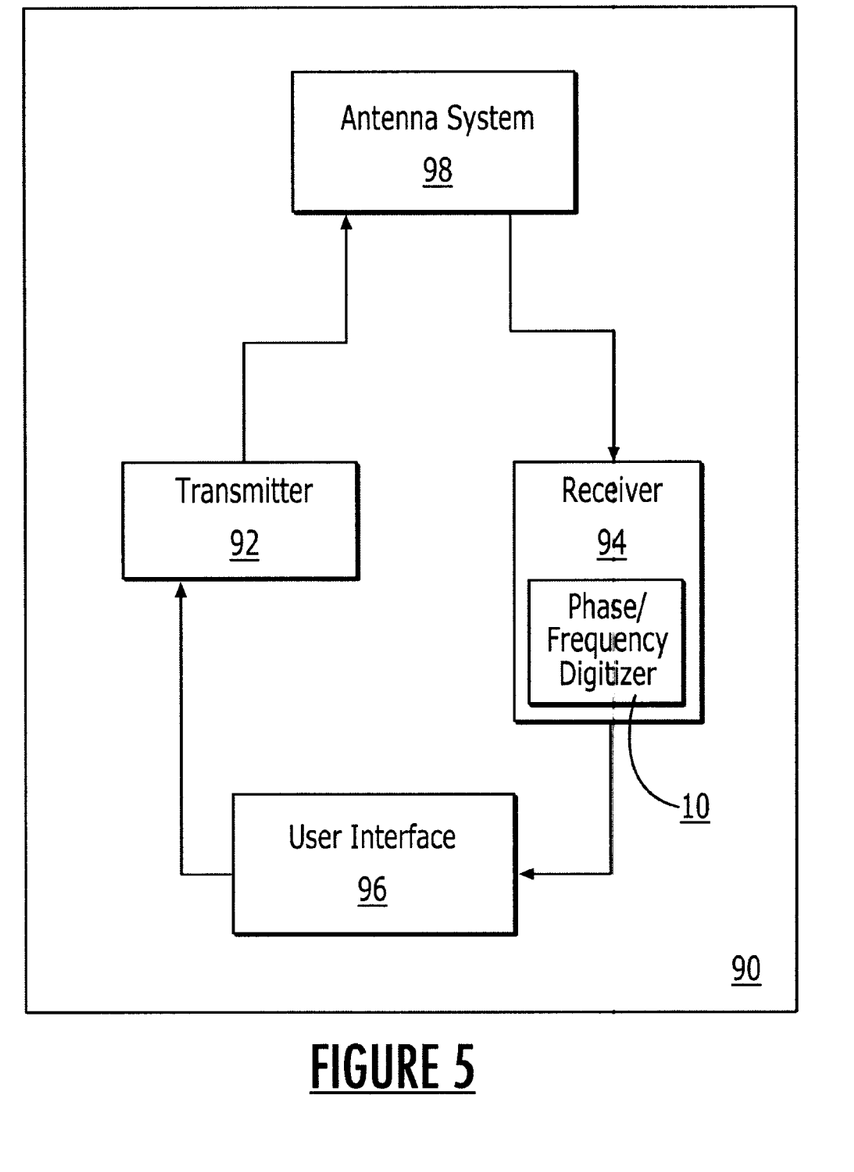
FIG. 5 is a block diagram of a radiotelephone including a system for extracting and optionally digitizing phase/frequency information according to the present invention.

In a preferred embodiment of the present invention, the above-described systems for extracting and/or digitizing phase and frequency information are implemented in a radiotelephone 90 which includes a phase/frequency extraction system 10 according to the present invention. Such a radiotelephone 90 is depicted in the block diagram of FIG. 5. As shown in FIG. 5, radiotelephone 90 typically includes a transmitter 92, a receiver 94, a user interface 96 and an antenna system 98. As is well known to those of skill in the art, transmitter 92 converts the information which is to be transmitted by radiotelephone 90 into an electromagnetic signal suitable for radio communications. Receiver 94 demodulates electromagnetic signals which are received by radiotelephone 90 so as to provide the information contained in the signals to user interface 96 in a format which is understandable to the user. A wide variety of transmitters 92, receivers 94, user interfaces 96 (e.g., microphones, keypads, rotary dials) and antenna systems 98 which are suitable for use with handheld radiotelephones are known to those of skill in the art, and such devices may be implemented in radiotelephone 90. The design of radiotelephone 90 other than the phase/frequency extraction system 10 is well known to those of skill in the art and will not be further described herein. Furthermore, as will be appreciated by those of skill in the art, the present invention may be utilized in a base station and such an embodiment of the present invention need not be further described herein.

In the drawings, specification and examples, there have been disclosed typical preferred embodiments of the invention and, although specific terms are employed, these terms are used in a generic and descriptive sense only and not for purposes of limitation, the scope of the invention being set forth in the following claims. Accordingly, those of skill in the art will themselves be able to conceive of embodiments of the phase/frequency extraction and digitization methods and systems other than those explicitly described herein without going beyond the scope of the present invention.

That which is claimed is:

1. A system for periodically determining at least one of the phase and the frequency of an analog input signal, comprising:
   a frequency discriminator responsive to said analog input signal which periodically determines the frequency of said analog input signal so as to provide a frequency value;
   a phase discriminator responsive to said analog input signal which periodically determines the phase of said analog input signal so as to provide a phase value;
   a control network operably associated with said frequency discriminator and said phase discriminator and which adjusts at least one of said frequency value and said phase value to provide at least one of an adjusted phase value and an adjusted frequency value,
   wherein said control network comprises:
      an error estimator which produces an error signal based on the frequency value and the phase value; and
      adjusting means responsive to said error signal for adjusting at least one of said frequency value and said phase value to provide at least one of said adjusted phase value and said adjusted frequency value; and
   means for digitally representing at least one of said adjusted phase value and said adjusted frequency value.

2. A radiotelephone, comprising:
   a transmitter for transmitting radio signals from the radiotelephone;
   a receiver for receiving radio signals received by the radiotelephone;
   an antenna system;
   a user interface; and
   means for digitally representing an adjusted frequency value;
   wherein said receiver further comprises:
      a frequency discriminator responsive to said received radio signals which periodically determines the frequency of said received radio signals so as to provide a first frequency value;
      a phase discriminator responsive to said received radio signals which periodically determines the phase of said received radio signals so as to provide a phase value; and
      a control network operably associated with said frequency discriminator and said phase discriminator which adjusts said first frequency value so as to provide the adjusted frequency value, wherein said control network comprises:
         an error estimator which produces an error signal based on the first frequency value and the phase value; and
         adjusting means responsive to said error signal for adjusting the amplitude of the first frequency value so as to provide said adjusted frequency value.

3. The radiotelephone of claim 2, further comprising a frequency-to-phase converter operably associated with said control network so as to convert said adjusted frequency value to provide an adjusted phase value.

4. The radiotelephone of claim 2, further comprising a phase-to-frequency converter operably associated with said phase discriminator so as to provide a second frequency value.

5. The radiotelephone of claim 4, wherein said error estimator comprises difference means for calculating the difference between an absolute value of said first frequency value and an absolute value of said second frequency value.

6. The radiotelephone of claim 5, wherein said error estimator further comprises a low pass filter operably associated with said difference means to filter the calculated difference between an absolute value of said first frequency value and an-absolute value of said second frequency value to provide a filtered error value.

7. The radiotelephone of claim 6, wherein said error estimator further comprises an integrator operably associated with said low pass filter and which integrates the filtered error value.

8. The radiotelephone of claim 5, wherein said error estimator further comprises an averager operably associated with said difference means to average the calculated difference between an absolute value of said first frequency value and an absolute value of said second frequency value to provide a filtered error value.

9. The radiotelephone of claim 2, wherein said adjusting means comprises an attenuator.

10. The radiotelephone of claim 2, further comprising an analog-to-digital converter operably associated with said phase discriminator so as to digitize said phase value and an analog-to-digital converter operably associated with said frequency discriminator so as to digitize said first frequency value.

11. The radiotelephone of claim 10, wherein said frequency discriminator has a substantially linear response over the bandwidth of said analog input signal.

12. A system for determining and digitally representing the phase of an input signal relative to the phase of a reference signal, comprising:
- a frequency discriminator responsive to said input signal which periodically determines a first frequency value corresponding to the frequency of said input signal;
- an analog-to-digital converter operably associated with said frequency discriminator so as to provide a digitized first frequency value;
- a phase digitizer responsive to said input signal which periodically determines a digitized phase value corresponding to the phase of said input signal;
- a phase-to-frequency converter operably associated with said phase digitizer so as to convert said digitized phase value to provide a digitized second frequency value;
- an error estimator which produces an error signal based on said digitized first frequency value and said digitized second frequency value;
- adjusting means for adjusting said digitized first frequency value based on said error signal; and
- a frequency-to-phase converter coupled to the output of said adjusting means.

13. The system of claim 12, wherein said adjusting means adjusts the amplitude of said digitized first frequency value.

14. The system of claim 13, wherein said error estimator comprises difference means for calculating the difference between an absolute value of said digitized first frequency value and an absolute value of said digitized second frequency value.

15. A system for determining and digitally representing the frequency of an input signal relative to a reference frequency, comprising:
- a frequency discriminator responsive to said input signal which periodically determines a first frequency value corresponding to the frequency of said input signal;
- an analog-to-digital converter operably associated with said frequency discriminator so as to provide a digitized first frequency value;
- a phase digitizer responsive to said input signal which periodically determines a digitized phase value corresponding to the phase of said input signal;
- a phase-to-frequency converter operably associated with said phase digitizer so as to convert said digitized phase value to provide a digitized second frequency value;
- an error estimator which produces an error signal based on said digitized first frequency value and said digitized second frequency value; and
- adjusting means for adjusting said digitized first frequency value based on said error signal.

16. The system of claim 15, wherein said adjusting means adjusts the amplitude of said digitized first frequency value.

17. The system of claim 16, wherein said error estimator comprises difference means for calculating the difference between an absolute value of said digitized first frequency value and an absolute value of said digitized second frequency value.

18. A method for determining and digitally representing at least one of the phase and frequency of an input signal using a frequency discriminator and a phase discriminator, comprising the steps of:
- generating a first estimate of the frequency of the input signal;
- generating an estimate of the phase of the input signal;
- converting the estimate of the phase into a second estimate of the frequency of the input signal;
- estimating an error in the first estimate of the frequency based on the second estimate of the frequency; and
- adjusting the first estimate of the frequency based on the error estimation so as to provide a corrected frequency estimate.

19. The method of claim 18, further comprising the step of converting the corrected frequency estimate into a corrected estimate of the phase.

20. The method of claim 18, wherein said steps of generating a first estimate of the frequency, generating an estimate of the phase and converting the estimate of the phase are repeated for a plurality of time samples of the input signal to provide first and second estimates of the frequency corresponding to each of the plurality of time samples, and wherein said step of estimating an error comprises:
- determining the difference between the first and second estimates of the frequency corresponding to each of the plurality of time samples to provide a plurality of the differences between the first and second estimates of the frequency;
- estimating the error based on an average of the plurality of the differences between the first and second estimates of the frequency.

21. The method of claim 20, wherein said step of determining the difference between the first and second estimates of the frequency corresponding to each of the plurality of time samples comprises:
- (a) determining an absolute value of the first and second frequency estimates corresponding to each of the plurality of time samples;
- (b) taking the difference between the absolute values of the first and second frequency estimates corresponding to each of the plurality of time samples;
- (c) adding one to the difference between the absolute values of the first and second frequency estimates; and
- repeating steps (a) through (c) for the first and second estimates of the frequency corresponding to each of the plurality of time samples.

22. The method of claim 18, wherein said step of adjusting the first estimate of the frequency comprises scaling the amplitude of the first estimate of the frequency proportional to the error estimation.

* * * * *